United States Patent
Hur et al.

(10) Patent No.: US 12,166,509 B2
(45) Date of Patent: *Dec. 10, 2024

(54) DUPLEXER WITH IMPEDANCE INVERTERS

(71) Applicant: Apple Inc., Cupertino, CA (US)

(72) Inventors: Joonhoi Hur, Sunnyvale, CA (US); Rastislav Vazny, Sunnyvale, CA (US)

(73) Assignee: Apple. Inc., Cupertino, CA (US)

(*) Notice: Subject to any disclaimer, the term of this patent is extended or adjusted under 35 U.S.C. 154(b) by 0 days.

This patent is subject to a terminal disclaimer.

(21) Appl. No.: 18/327,705

(22) Filed: Jun. 1, 2023

(65) Prior Publication Data

US 2023/0308118 A1    Sep. 28, 2023

Related U.S. Application Data

(63) Continuation of application No. 17/481,114, filed on Sep. 21, 2021, now Pat. No. 11,705,927, which is a (Continued)

(51) Int. Cl.
*H04B 1/00* (2006.01)
*H03F 1/02* (2006.01)
(Continued)

(52) U.S. Cl.
CPC ......... *H04B 1/0057* (2013.01); *H03F 1/0288* (2013.01); *H03F 1/56* (2013.01); *H04B 1/123* (2013.01); *H03F 2200/451* (2013.01)

(58) Field of Classification Search
CPC ...... H04B 1/0057; H04B 1/04; H04B 1/0475; H04B 1/40; H04B 1/401; H04B 1/10;
(Continued)

(56) References Cited

U.S. PATENT DOCUMENTS 4,577,168 A * 3/1986 Hartmann ............ H03H 9/6409
333/170
5,678,209 A   10/1997 Strakovsky
(Continued)

FOREIGN PATENT DOCUMENTS

CN    102932288 A    2/2013
CN    103312355 A    9/2013
(Continued)

OTHER PUBLICATIONS

Office Action for Korean Patent Application No. 10-2021-0067024 dated Jan. 21, 2022; 4 pgs.
(Continued)

*Primary Examiner* — Quochien B Vuong
(74) *Attorney, Agent, or Firm* — Fletcher Yoder, P.C.

(57) ABSTRACT

A duplexer may be used to isolate a transmitter and a receiver that share a common antenna. By using impedance gradients to provide impedances that cause balance-unbalance transformers (balun) of the duplexer to cut-off access to the common antenna rather than duplicate the antenna impedance, the duplexer is balanced. Such cut-offs may have a lower insertion loss than a duplexer that merely duplicates the antenna impedance to separate the differential signals of the receiver and transmitter from the common mode signal.

20 Claims, 9 Drawing Sheets

Related U.S. Application Data continuation of application No. 16/899,741, filed on Jun. 12, 2020, now Pat. No. 11,177,837.

(51) Int. Cl.
  *H03F 1/56* (2006.01)
  *H04B 1/12* (2006.01)
  *H04B 1/38* (2015.01)

(58) Field of Classification Search
  CPC ... H04B 1/16; H04B 1/38; H04B 1/44; H04B 1/123; H04B 1/525; H04B 1/715; H04B 1/1036; H04B 15/00; H03F 1/0288; H03F 1/56; H03H 7/42; H03H 7/463; H03H 9/725; H03H 11/32; H03H 11/344; H03H 7/425
  See application file for complete search history.

(56) References Cited

U.S. PATENT DOCUMENTS

| | | |
|---|---|---|
| 6,735,418 B1 | 5/2004 | MacNally et al. |
| 7,236,519 B2 * | 6/2007 | Kubo ................... H04B 1/56 455/73 |
| 7,373,115 B2 | 3/2008 | Monroe |
| 7,777,597 B2 | 8/2010 | Beaudin et al. |
| 7,822,393 B2 | 10/2010 | Hirano et al. |
| 8,036,606 B2 | 10/2011 | Kenington |
| 8,099,058 B1 | 1/2012 | Morris et al. |
| 8,175,013 B2 | 5/2012 | Moon et al. |
| 8,786,384 B2 | 7/2014 | Jian |
| 8,971,219 B2 | 3/2015 | Choksi |
| 9,083,441 B2 | 7/2015 | Sahota et al. |
| 10,056,875 B1 | 8/2018 | Beaudin et al. |
| 10,476,478 B2 | 11/2019 | Schmidhammer |
| 10,666,231 B2 | 5/2020 | Andersson |
| 10,862,524 B2 | 12/2020 | Hoogzaad et al. |
| 10,911,022 B2 | 2/2021 | Schmidhammer |
| 10,938,542 B1 * | 3/2021 | Muharemovic .......... H04B 1/18 |
| 2010/0156600 A1 | 6/2010 | Duron et al. |
| 2013/0009724 A1 | 1/2013 | Xu et al. |
| 2013/0038502 A1 | 2/2013 | Erdem |
| 2013/0063208 A1 | 3/2013 | Acimovic |
| 2013/0241669 A1 | 9/2013 | Mikhemar et al. |
| 2013/0241670 A1 | 9/2013 | Mikhemar et al. |
| 2015/0333791 A1 | 11/2015 | Anderson et al. |
| 2017/0155374 A1 | 6/2017 | Schmidhammer |
| 2018/0269723 A1 | 9/2018 | Chen et al. |
| 2019/0238172 A1 | 8/2019 | Hoogzaad et al. |
| 2019/0245520 A1 | 8/2019 | Andersson |
| 2020/0081080 A1 | 3/2020 | Zemskov et al. |

FOREIGN PATENT DOCUMENTS

| | | |
|---|---|---|
| CN | 103650355 A | 3/2014 |
| CN | 103797707 A | 5/2014 |
| CN | 103907290 A | 7/2014 |
| CN | 105099414 A | 11/2015 |
| CN | 104205628 A | 5/2016 |
| CN | 107005098 A | 8/2017 |
| CN | 110895318 A | 3/2020 |
| JP | 2017526201 A | 9/2017 |
| TW | 466839 B | 12/2001 |
| WO | 2010044502 A1 | 4/2010 |

OTHER PUBLICATIONS

Office Action for Chinese Patent Application No. 20210567374.1 dated Jun. 8, 2022; 5 pgs.
Korean Office Action for Korean Application No. 10-22-0117102 dated Oct. 11, 2022; 3 pgs.
Zeng Zheng, "Advanced Grid-connected Inverter for Renewable energy Decentralized Access"; China Journal of Electrical Engineering, Dec. 31, 2013; 12 pgs.
Search Report for Notice of grant for Chinese Patent Application No. 20210567374.1 dated Jun. 29, 20223.
Notification to Grant Patent and Search Report for Chinese Patent Application 202211122578.5 dated May 21, 2024; 4 pgs.

* cited by examiner

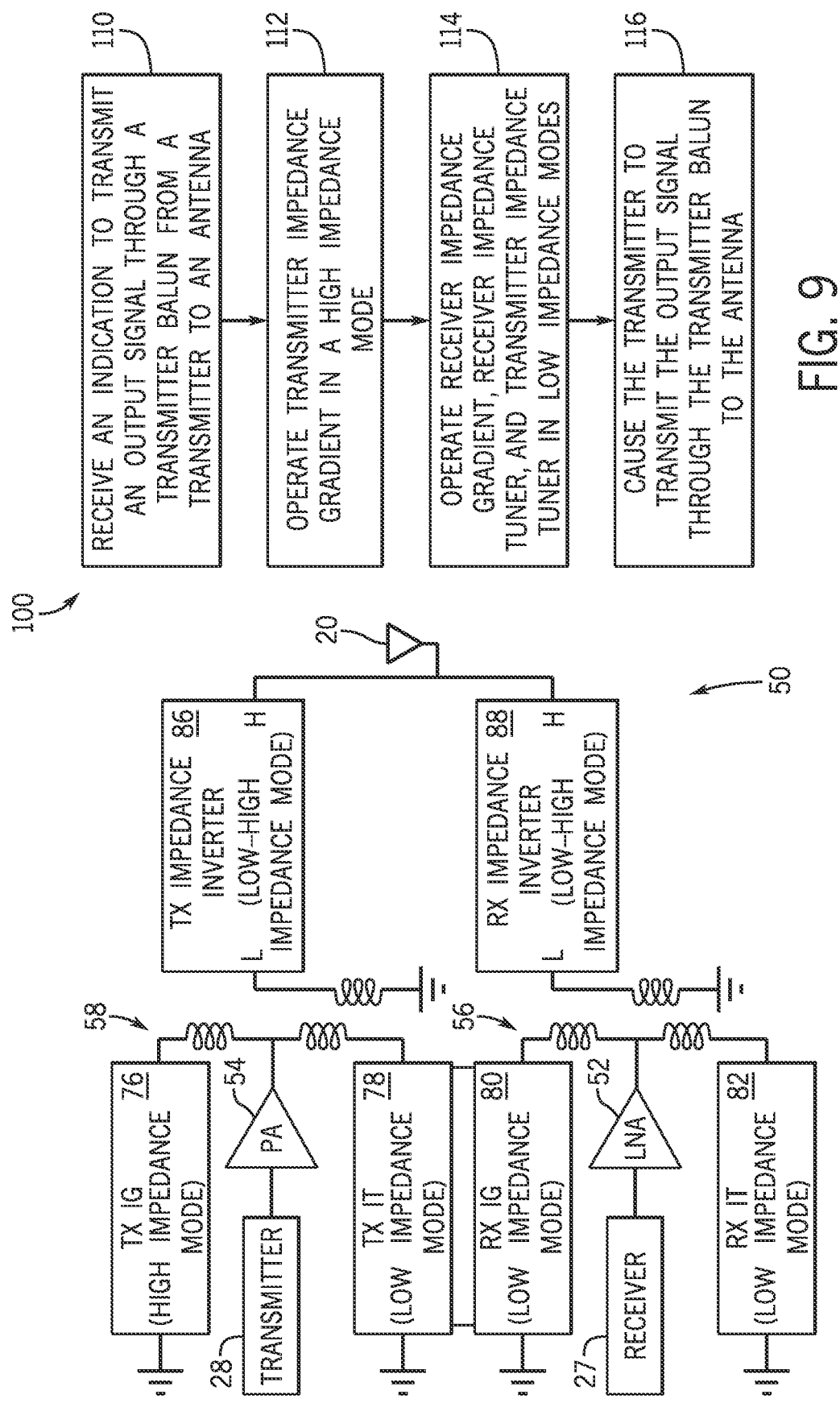

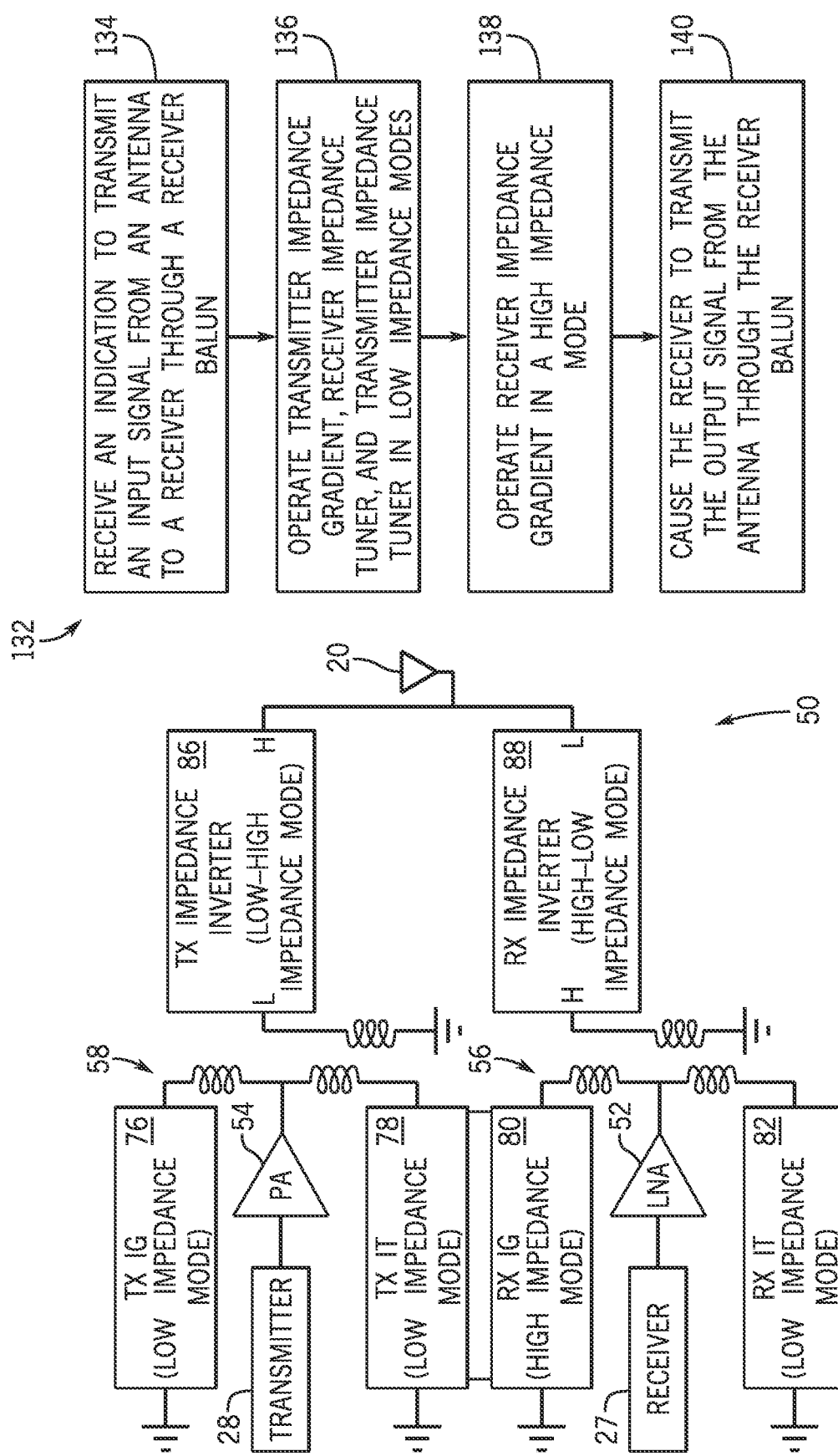

DUPLEXER WITH IMPEDANCE INVERTERS

CROSS-REFERENCE TO RELATED APPLICATION

This application is a continuation of U.S. patent application Ser. No. 17/481,114, entitled "DUPLEXER WITH IMPEDANCE INVERTERS," filed Sep. 21, 2021, which is a continuation of U.S. patent application Ser. No. 16/899,741, entitled "DUPLEXER WITH IMPEDANCE INVERTERS," filed Jun. 12, 2020, now U.S. Pat. No. 11,177,837, each of which are hereby incorporated by reference in its entirety for all purposes.

BACKGROUND

The present disclosure relates generally to wireless communication systems and, more specifically, to systems and methods using electrical balanced duplexers.

This section is intended to introduce the reader to various aspects of art that may be related to various aspects of the present disclosure, which are described and/or claimed below. This discussion is believed to be helpful in providing the reader with background information to facilitate a better understanding of the various aspects of the present disclosure. Accordingly, it should be understood that these statements are to be read in this light, and not as admissions of prior art.

Certain electronic devices may include transmitters and receivers that couple to antennas to transmit and receive signals. The transmitters and receivers may be included in transceivers. These electronic devices may use electrical balanced duplexers to isolate transmit signals and receive signals from each other and/or to control connection of transmitters or receiver to the antennas. An electrical balanced duplexer may include one or more balance-unbalance transformer (balun) circuits. Each balun circuit may include windings coupled to impedance gradients that provide an impedance that corresponds to a frequency of a signal to enable the signal to pass through or to block the signal. For example, some embodiments may include a transmitter balun that is configured to block signals from the antenna from crossing the transmitter balun to the transmitter in response to receiving a first impedance (e.g., a high impedance) provided at a first frequency from a transmitter impedance gradient, while enabling signals from the transmitter to traverse the transmitter balun in response to receiving a second impedance (e.g., a low impedance) at a second frequency from the transmitter impedance gradient. This frequency division is applied by the electrical balanced duplexer because the first and second frequencies are different. For instance, the first frequency and the second frequency may fall in different frequency ranges (i.e., non-overlapping frequency bands).

The electrical balanced duplexer may block transmit frequencies from traversing the transmitter balun while receiving signals and may block receive frequencies from traversing the receiver balun while transmitting signals when operating ideally. However, in an actual operation, and thus subjugated to non-ideal operating conditions, the electrical balanced duplexer may provide less effective isolation when filtering receive signals from transmit signals, or vice versa.

SUMMARY

A summary of certain embodiments disclosed herein is set forth below. It should be understood that these aspects are presented merely to provide the reader with a brief summary of these certain embodiments and that these aspects are not intended to limit the scope of this disclosure. Indeed, this disclosure may encompass a variety of aspects that may not be set forth below.

Certain wireless electronic devices use duplexers to enable transmitters and receivers to share an antenna. In some situations, the electronic device may be used across multiple different frequencies. An electrical balance duplexer (EBD) may be used to accommodate a relatively more dynamic frequency usage compared to arrays of passband filters and/or other methods. The EBD may include balance-unbalance transformer (balun) circuits that include windings to induce electromagnetic fields. The windings may couple to an impedance gradient that provides an impedance at a corresponding frequency to enable/block signal traversal through the balun. For example, some embodiments may leverage a first impedance (e.g., a high impedance) of a transmitter impedance gradient affecting a first frequency range to block signals from the antenna. Blocking signals from the antenna may involve stopping signals received at the antenna from traversing the transmitter balun to the transmitter while permitting other signals. For example, signals corresponding to a transmit frequency range may be permitted to traverse the transmitter balun for transmission via the antenna while signals corresponding to a receive frequency range may not be permitted to traverse the transmitter balun. This frequency division is applied by the EBD because the first and second frequencies are different. For instance, the first and second frequency may fall in different (i.e., non-overlapping) frequency bands. It is noted that any frequency range may be used for the transmit frequency range and the receive frequency range. Furthermore, the transmit frequency range may overlap with the receive frequency range, such as when the duplexer is operated in a half duplexer operational mode that performs transmit operations non-simultaneous to receive operations. It is noted that the presently disclosed techniques may be applied to any suitable frequency division duplex (FDD) system and/or any suitable time division duplex (TDD) system, and may be applied over any suitable range of frequencies. As a non-limiting example, when used in $5^{th}$ generation (5G) radio frequency systems (e.g., New Radio (NR)), the transmit frequency range and/or the receive frequency range may include frequencies between 600 Megahertz (MHz) and 700 MHz for low-band 5G applications, 2.5 Gigahertz (GHz) and 3.7 GHz for middle-band 5G applications, and 25 GHz and 42 GHz (e.g., 25 GHz and 39 GHz) for high-band 5G applications.

A receiver balun may operate similar to the transmitter balun. For example, the receiver balun may be configured to receive a first impedance at a first frequency from a receiver impedance gradient to block signals from the transmitter from crossing the receiver balun to the receiver, while enabling signals from the antenna to traverse the receiver balun using a second impedance at a second frequency from the receiver impedance gradient. This frequency division is applied by the EBD because the first frequency and the second frequency are different. For instance, the first frequency and the second frequency may fall in different (i.e., non-overlapping frequency bands). The impedance gradients may be assisted by impedance tuners that reduce demands on the impedance gradients. For example, the impedance tuners include circuitry (e.g., inductors, capacitors, resistors) that may provide a low impedance in a pass band (e.g., to facilitate pass through of signals) while matching an impedance of a corresponding impedance gradient in a block band (e.g., to facilitate blocking signals).

However, operation of the impedance gradients and the impedance tuners to isolate receive operations from transmit operations, and vice versa, may be improved by the inclusion of impedance inverters and/or notch filters affecting signals transmitted or received from the antenna. For example, an impedance inverter may be coupled between the transmitter balun and the antenna. The impedance inverter, when coupled in this way, may provide an impedance that more effectively blocks receive signals (e.g., signals received at the antenna within the receive frequency band) from traversing the transmitter balun. An impedance inverter coupled between the receiver balun and the antenna may operate in a similar fashion. Additionally or alternatively, a filter may be coupled to an output of the impedance gradient and to an output of the impedance tuner. The filter may generate a virtual short for a stop band of the filter to perform additional isolation to isolate operations of the EBD, thereby improving operation of the EBD.

BRIEF DESCRIPTION OF THE DRAWINGS

Various aspects of this disclosure may be better understood upon reading the following detailed description and upon reference to the drawings in which:

FIG. 8 is a block diagram of the EBD of FIG. 7 in a transmit operational mode, in accordance with embodiments of the present disclosure;

FIG. 9 is a flow chart of a process for operating the EBD of FIG. 7 in the transmit operational mode, in accordance with embodiments of the present disclosure;

FIG. 10 is a block diagram of the EBD of FIG. 7 in a receive operational mode, in accordance with embodiments of the present disclosure;

FIG. 11 is a flow chart of a process for operating the EBD of FIG. 7 in the receive operational mode, in accordance with embodiments of the present disclosure;

DETAILED DESCRIPTION OF SPECIFIC EMBODIMENTS

One or more specific embodiments will be described below. In an effort to provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

Figure 1:
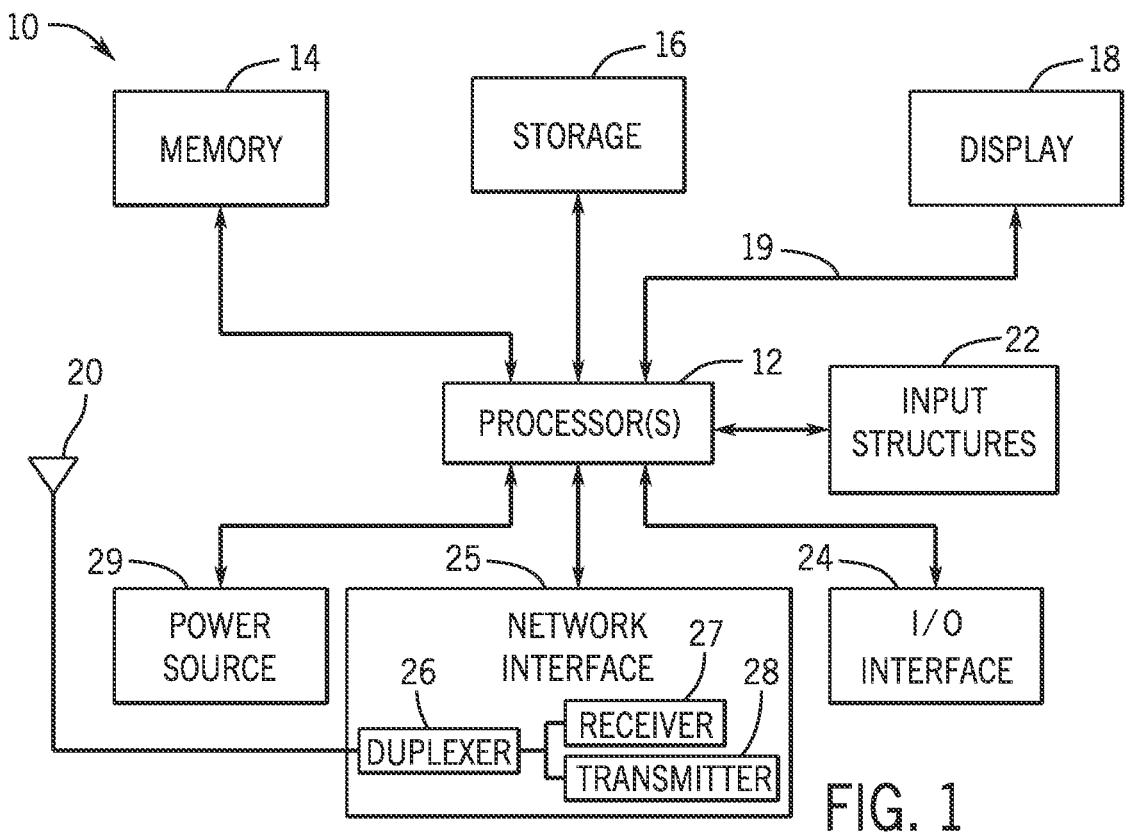
FIG. 1 is a block diagram of an electronic device that includes a duplexer, in accordance with an embodiment of the present disclosure.

With the foregoing in mind, there are many suitable electronic devices that may benefit from the embodiments of duplexers described herein. Turning first to FIG. 1, an electronic device 10 according to an embodiment of the present disclosure may include, among other things, one or more processors 12, memory 14, nonvolatile storage 16, a display 18, antennas 20, input structures 22, an input/output (I/O) interface 24, a network interface 25, and a power source 29. The various functional blocks shown in FIG. 1 may include hardware elements (including circuitry), software elements (including computer code stored on a computer-readable medium), or a combination of both hardware and software elements. It should be noted that FIG. 1 is merely one example of a particular implementation and is intended to illustrate the types of components that may be present in electronic device 10.

Figure 2:
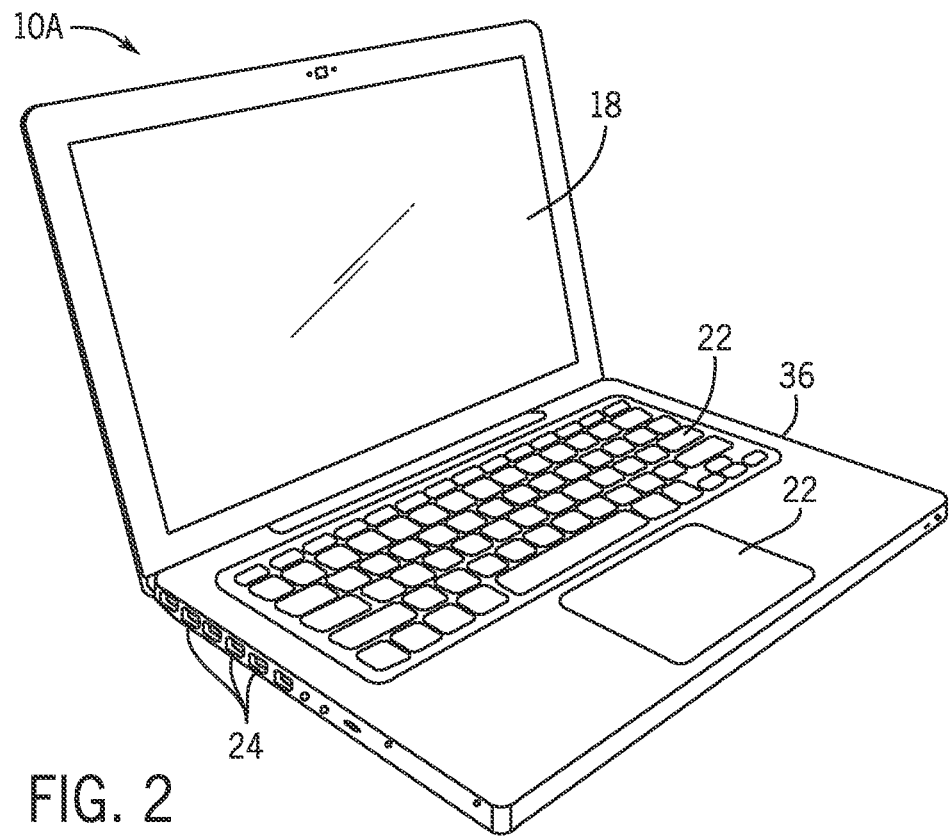
FIG. 2 is a perspective view of a notebook computer representing an embodiment of the electronic device of FIG. 1.
Figure 4:
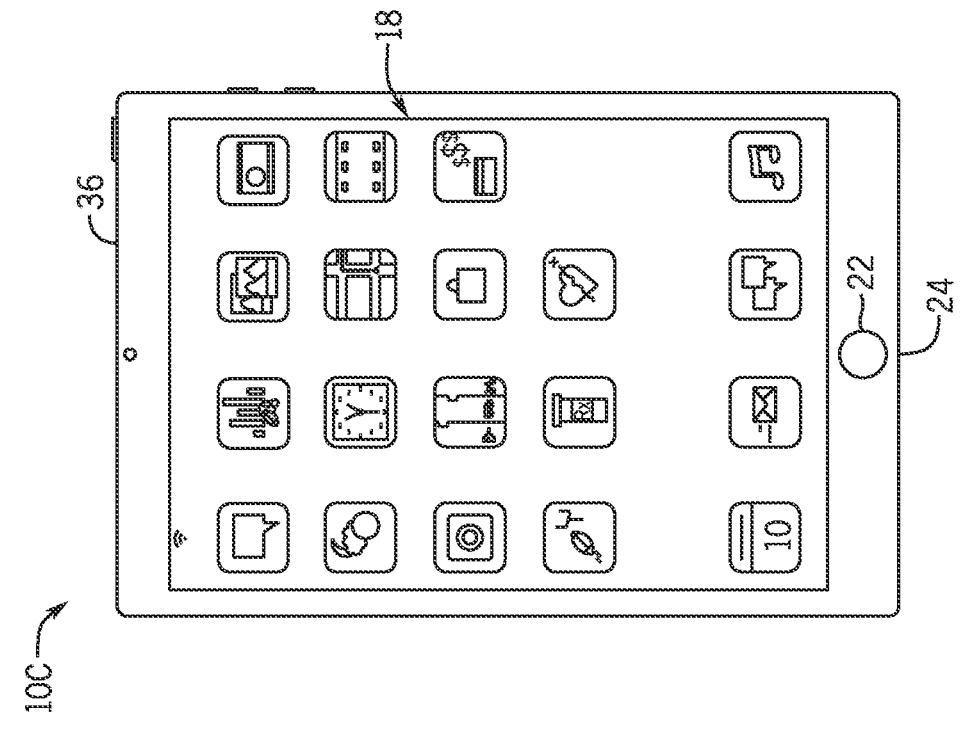
FIG. 4 is a front view of another hand-held device representing another embodiment of the electronic device of FIG. 1.
Figure 3:
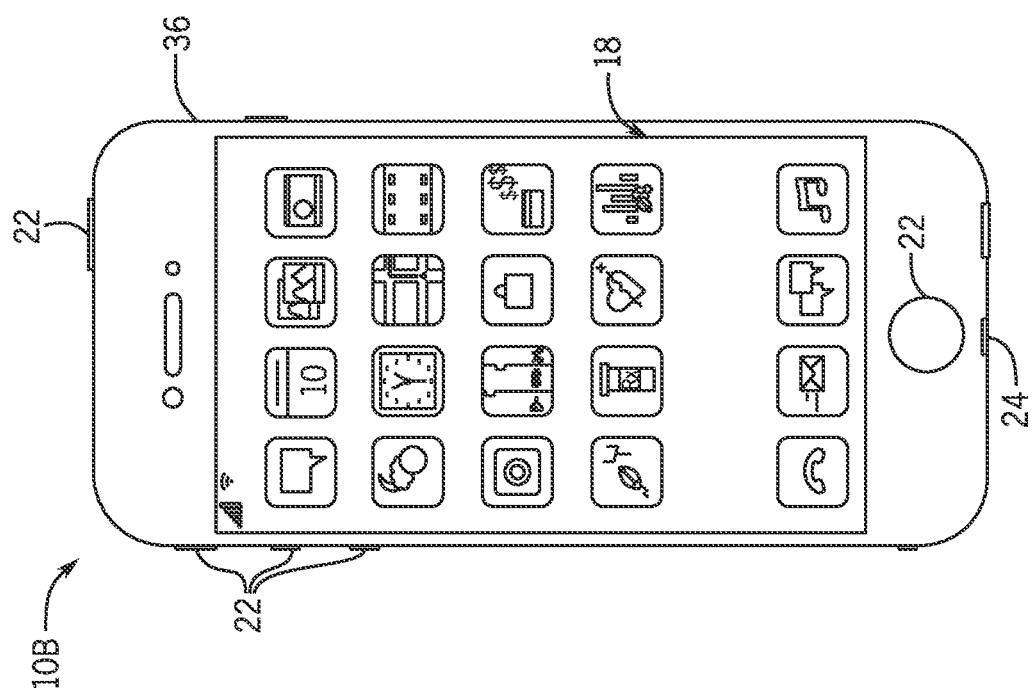
FIG. 3 is a front view of a hand-held device representing another embodiment of the electronic device of FIG. 1.
Figure 5:
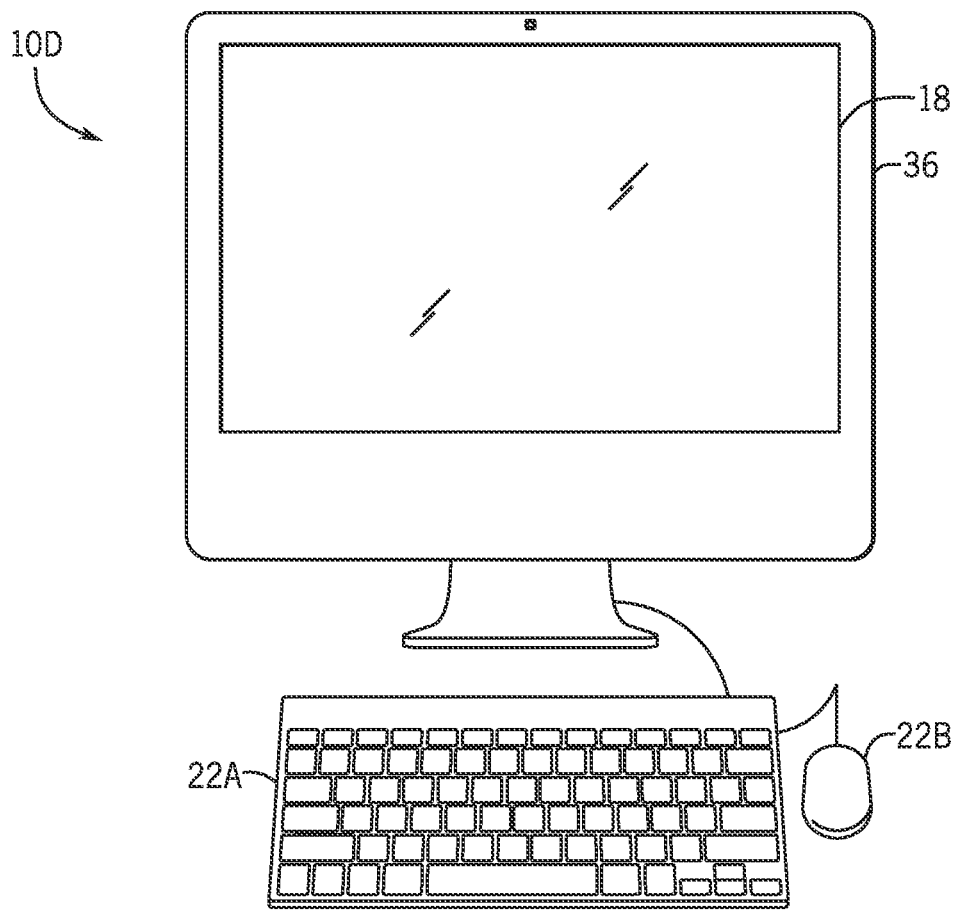
FIG. 5 is a front view of a desktop computer representing another embodiment of the electronic device of FIG. 1.
Figure 6:
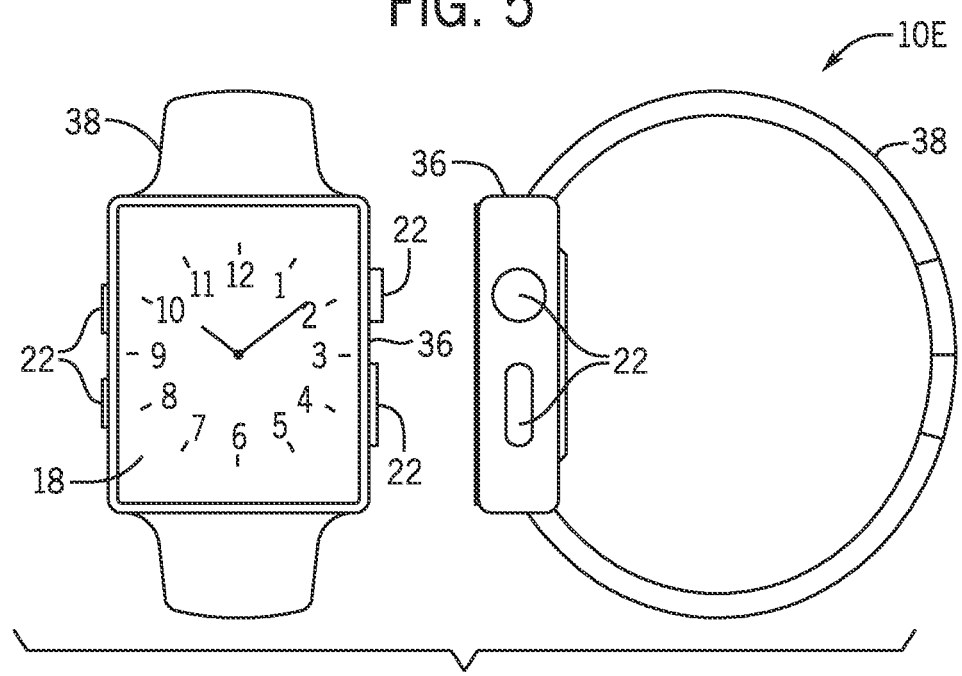
FIG. 6 is a front view and side view of a wearable electronic device representing another embodiment of the electronic device of FIG. 1.

By way of example, the electronic device 10 may represent a block diagram of the notebook computer depicted in FIG. 2, the hand-held device depicted in FIG. 3, the hand-held device depicted in FIG. 4, the desktop computer depicted in FIG. 5, the wearable electronic device depicted in FIG. 6, or similar devices. It should be noted that the processors 12 and other related items in FIG. 1 may be generally referred to herein as "data processing circuitry." Such data processing circuitry may be embodied wholly or in part as software, firmware, hardware, or any combination thereof. Furthermore, the data processing circuitry may be a single contained processing module or may be incorporated wholly or partially within any of the other elements within the electronic device 10.

In the electronic device 10 of FIG. 1, the processors 12 may be operably coupled with the memory 14 and the nonvolatile storage 16 to perform various algorithms. Such programs or instructions executed by the processors 12 may be stored in any suitable article of manufacture that includes one or more tangible, computer-readable media at least collectively storing the instructions or routines, such as the memory 14 and the nonvolatile storage 16. The memory 14 and the nonvolatile storage 16 may include any suitable articles of manufacture for storing data and executable instructions, such as random-access memory, read-only memory, rewritable flash memory, hard drives, and optical discs. In addition, programs (e.g., an operating system) encoded on such a computer program product may also include instructions executed by the processors 12 to enable the electronic device 10 to provide various functionalities.

In certain embodiments, the display 18 may be a liquid crystal display (LCD), which may allow users to view images generated on the electronic device 10. In some embodiments, the display 18 may include a touch screen, which may allow users to interact with a user interface of the electronic device 10. Furthermore, it should be appreciated that, in some embodiments, the display 18 may include one or more organic light emitting diode (OLED) displays, or some combination of LCD panels and OLED panels.

The input structures 22 of the electronic device 10 may enable a user to interact with the electronic device 10 (e.g., pressing a button to increase or decrease a volume level). The I/O interface 24 may enable electronic device 10 to interface with various other electronic devices, as may the network interface 25. The network interface 25 may include, for example, one or more interfaces for a personal area network (PAN), such as a Bluetooth network, for a local area network (LAN) or wireless local area network (WLAN), such as an 802.11x Wi-Fi network, and/or for a wide area network (WAN), such as a 3rd generation (3G) cellular network, universal mobile telecommunication system (UMTS), 4th generation (4G) cellular network, long term evolution (LTE) cellular network, or long term evolution license assisted access (LTE-LAA) cellular network, 5th generation (5G) cellular network, and/or 5G New Radio (5G NR) cellular network. The network interface 25 may also include one or more interfaces for, for example, broadband fixed wireless access networks (WiMAX), mobile broadband Wireless networks (mobile WiMAX), asynchronous digital subscriber lines (e.g., ADSL, VDSL), digital video broadcasting-terrestrial (DVB-T) and its extension DVB Handheld (DVB-H), ultra-wideband (UWB), alternating current (AC) power lines, and so forth. For example, network interfaces 25 may be capable of joining multiple networks, and may employ one or more antennas 20 to that end. Additionally or alternatively, the network interfaces 25 may include at least one duplexer 26 that enables multiple components (e.g., the receiver 27 and the transmitter 28) with separate paths (e.g., transmit path and receive path) to use one of the antennas 20 while providing separation between the multiple components. As further illustrated, the electronic device 10 may include a power source 29. The power source 29 may include any suitable source of power, such as a rechargeable lithium polymer (Li-poly) battery and/or an alternating current (AC) power converter.

In certain embodiments, the electronic device 10 may take the form of a computer, a portable electronic device, a wearable electronic device, or other type of electronic device. Such computers may include computers that are generally portable (such as laptop, notebook, and tablet computers) as well as computers that are generally used in one place (such as desktop computers, workstations, and/or servers). In certain embodiments, the electronic device 10 in the form of a computer may be a model of a MACBOOK®, MACBOOK® PRO, MACBOOK AIR®, IMAC®, MAC® MINI, OR MAC PRO® available from Apple Inc. of Cupertino, California. By way of example, the electronic device 10, taking the form of a notebook computer 10A, is illustrated in FIG. 2 in accordance with one embodiment of the present disclosure. The depicted notebook computer 10A may include a housing or enclosure 36, a display 18, input structures 22, and ports of an I/O interface 24. In one embodiment, the input structures 22 (such as a keyboard and/or touchpad) may be used to interact with the notebook computer 10A, such as to start, control, or operate a graphical user interface (GUI) or applications running on notebook computer 10A. For example, a keyboard and/or touchpad may allow a user to navigate a user interface or application interface displayed on display 18.

FIG. 3 depicts a front view of a hand-held device 10B, which represents one embodiment of the electronic device 10. The hand-held device 10B may represent, for example, a portable phone, a media player, a personal data organizer, a hand-held game platform, or any combination of such devices. By way of example, the hand-held device 10B may be a model of an IPOD® OR IPHONE® available from Apple Inc. of Cupertino, California. The hand-held device 10B may include an enclosure 36 to protect interior components from physical damage and to shield them from electromagnetic interference. The enclosure 36 may surround the display 18. The I/O interfaces 24 may open through the enclosure 36 and may include, for example, an I/O port for a hardwired connection for charging and/or content manipulation using a standard connector and protocol, such as the LIGHTNING CONNECTOR® available from Apple Inc. of Cupertino, California, a universal serial bus (USB), or other similar connector and protocol.

The input structures 22, in combination with the display 18, may allow a user to control the hand-held device 10B. For example, the input structures 22 may activate or deactivate the hand-held device 10B, navigate user interface to a home screen, a user-configurable application screen, and/or activate a voice-recognition feature of the hand-held device 10B. Other input structures 22 may provide volume control, or may toggle between vibrate and ring modes. The input structures 22 may also include a microphone may obtain a user's voice for various voice-related features, and a speaker may enable audio playback and/or certain phone capabilities. The input structures 22 may also include a headphone input may provide a connection to external speakers and/or headphones.

FIG. 4 depicts a front view of another hand-held device 10C, which represents another embodiment of the electronic device 10. The hand-held device 10C may represent, for example, a tablet computer, or one of various portable computing devices. By way of example, the hand-held device 10C may be a tablet-sized embodiment of the electronic device 10, which may be, for example, a model of an IPAD® available from Apple Inc. of Cupertino, California.

Turning to FIG. 5, a computer 10D may represent another embodiment of the electronic device 10 of FIG. 1. The computer 10D may be any computer, such as a desktop computer, a server, or a notebook computer, but may also be a standalone media player or video gaming machine. By way of example, the computer 10D may be an IMAC®, a MACBOOK®, or other similar device by Apple Inc. of Cupertino, California. It should be noted that the computer 10D may also represent a personal computer (PC) by another manufacturer. A similar enclosure 36 may be provided to protect and enclose internal components of the computer 10D such as the display 18. In certain embodiments, a user of the computer 10D may interact with the computer 10D using various input structures 22, such as the keyboard 22A or mouse 22B, which may connect to the computer 10D.

Similarly, FIG. 6 depicts a wearable electronic device 10E representing another embodiment of the electronic device 10 of FIG. 1 that may be configured to operate using the techniques described herein. By way of example, the wearable electronic device 10E, which may include a wristband 38, may be an APPLE WATCH® by Apple Inc. of Cupertino, California. However, in other embodiments, the wearable electronic device 10E may include any wearable electronic device such as, for example, a wearable exercise monitoring device (e.g., pedometer, accelerometer, heart rate monitor), or other device by another manufacturer. The display 18 of the wearable electronic device 10E may include a touch screen display 18 (e.g., LCD, OLED display, active-matrix organic light emitting diode (AMOLED) display, and so forth), as well as input structures 22, which may allow users to interact with a user interface of the wearable electronic device 10E.

Some electronic devices, such as the electronic device 10, may use one or more duplexers to separate receive signals from transmit signals, or vice versa. Some duplexers may include filters, such as surface-acoustic wave (SAW) filters and/or bulk-acoustic waves (BAW) filters that operate based on microacoustic principles, or such as an inductor-capacitor-resistor (LCR) filter that operates based on resonating circuits of inductors and capacitors to separate signals between the transmitter and the receiver.

In addition to or in the alternative to SAW/BAW filters, a complementary metal-oxide-semiconductor (CMOS) N-Path filter, a spatio-temporal circulator, or any suitable components of an electrical balanced duplexer (EBD) may be used in the duplexers. Furthermore, some duplexers use an active replica of an antenna impedance to more effectively isolate transmitter and receiver signals. An antenna impedance shift may disturb the duplex function and degrade the isolation between the transmit path and the receive path. As discussed below in more detail, the EBD discussed herein may differ from some EBDs at least in that a balun of the disclosed EBD is used to cut off the path to the antenna and not just to separate differential signals of the receiver and/or the transmitter from a common mode signal between the receiver and/or the transmitter.

Figure 7:
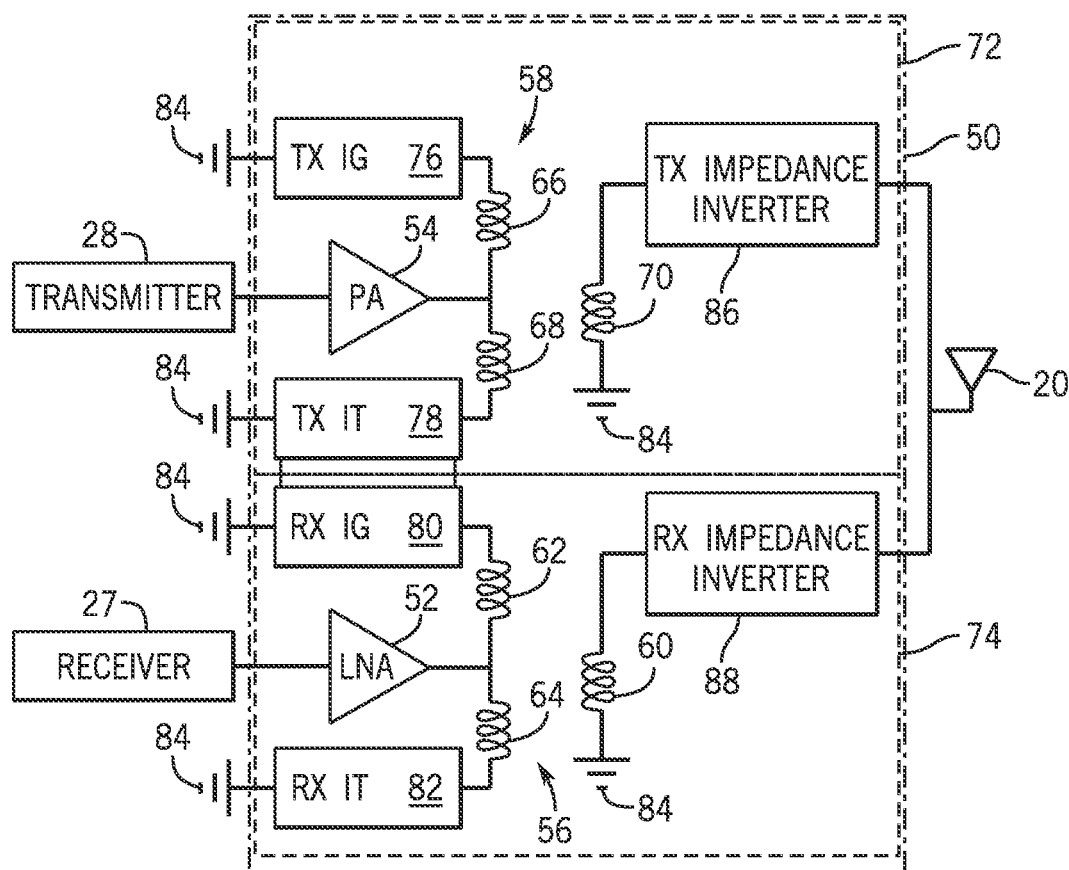
FIG. 7 is a block diagram of the duplexer of FIG. 1 in the form of an electrical balance duplexer (EBD), in accordance with embodiments of the present disclosure.

With the foregoing in mind, FIG. 7 is a block diagram of an example duplexer 26, duplexer 50. As illustrated, the duplexer 50 provides isolation between the receiver 27 and the transmitter 28 while enabling both the receiver 27 and the transmitter 28 to utilize the antenna 20. As illustrated, the duplexer 50 may include a low-noise amplifier (LNA) 52 that may be used to amplify signals received by the antenna 20 before the signal reach the receiver 27. In some embodiments, one or more additional amplifiers may be located downstream of the LNA 52, such as within the receiver 27, in addition to or in the alternative to the LNA 52 within the duplexer 50. The duplexer 50 may also include a power amplifier (PA) 54 that receives signals from the transmitter 28. The PA 54 amplifies the signals to a suitable level to drive the transmission of the signals via the antenna 20. In some embodiments, an iteration of the PA 54 may be located within the transmitter 28 and/or upstream of the PA 54 in addition to or in the alternative to the PA 54 within the duplexer 50. These signals may then be transmitted via the antenna 20.

The duplexer 50 may include one or more receiver baluns and one or more transmitter baluns. Each of the baluns (e.g., receiver balun 56, transmitter balun 58) may include windings to permit a signal to traverse the respective balun. For example, the receiver balun 56 includes a primary winding 60 used to selectively pass a signal from the antenna 20 to the LNA 52 (and to the receiver 27) by inducing a signal in a secondary winding 62 and/or a secondary winding 64. For the transmitter balun 58, signals from the PA 54 (and thus from the transmitter 28) are passed to antenna 20 from primary winding 66 and/or primary winding 68 and induced in a secondary winding 70. This arrangement of baluns may reduce insertion loss relative to a duplexer that uses an antenna replica when separating common mode signals from differential signals between the receiver 27 and the transmitter 28. Furthermore, the duplexer 50 may reduce or eliminate dependency on an antenna replica to improve flexibility of frequencies used to communicate via the antenna 20.

The duplexer 50 may include transmitter balun circuitry 72 that includes the transmitter balun 58. The duplexer 50 may also include receiver balun circuitry 74 that includes the receiver balun 56. The transmitter 28 may couple to a first side of the transmitter balun 58 and the antenna 20 may generally couple to a second side of the transmitter balun 58. The receiver 27 may couple to a first side of the receiver balun 56 and the antenna 20 may generally couple to a second side of the receiver balun 56.

The transmitter balun circuitry 72 and the receiver balun circuitry 74 may enable blocking or passing of signals transmitting via a corresponding path (e.g., between the antenna 20 and the receiver 27, the transmitter 28, or both). The transmitter balun circuitry 72 and/or the receiver balun circuitry 74 may perform this selective passing and/or blocking by employing impedance gradients and/or impedance tuners. For example, a transmitter impedance gradient 76 (TX IG) may couple (e.g., electrically couple the transmitter impedance gradient 76 to the transmitter balun 58 and thus the transmitter 28) to the primary winding 66 of the transmitter balun 58 and a transmitter impedance tuner 78 (TX IT) may couple to the primary winding 68 of the transmitter balun 58, and the transmitter impedance gradient 76 and/or the transmitter impedance tuner 78 may perform blocking and/or passing operations of the transmitter balun 58. Similarly, the receiver balun circuitry 74 may include a receiver impedance gradient 80 (RX IG) coupled to a secondary winding 62 of the receiver balun 56 and a receiver impedance tuner 82 (RX IT) coupled to a secondary winding 64 of the receiver balun 56 (e.g., electrically couple the receiver impedance gradient 80 to the receiver balun 56 and thus to the receiver 27), and the receiver impedance gradient 80 and/or the receiver impedance tuner 82 may perform blocking and/or passing operations of the receiver balun 56. The transmitter impedance gradient 76 and/or the receiver impedance gradient 80 may include discrete lumped components and/or distributed components that set desired impedances for certain frequencies and may couple certain frequencies to ground 84 with a low impedance.

Regardless of implementation type, the transmitter impedance gradient 76 and/or the receiver impedance gradient 80 may act as filters having a relative high impedance (e.g., acting as an open circuit) in a "pass" band compared to a relative low impedance (e.g., acting as a shorted line coupled to ground) in a "block" band. Generally, the impedance provided by the high impedance mode is higher than the impedance provided by the low impedance mode. In particular, the impedance provided by the high impedance mode approaches an infinite impedance and the impedance provided by the low impedance mode approaches zero impedance. However, certain circuits may have particular impedance values. For example, capacitive-based impedances may have relatively low capacitance values between 0.1 picofarads (pF) and 4.0 pF (e.g., 0.19 pF, 3.7 pF, 0.1-0.2 pF, 3.0-4.5 pF) and high capacitance values around approximately 30 pF (e.g., between 20 pF and 35 pF). In some cases, low impedances may equal approximately 50 ohms ($\Omega$) or less (e.g., 40-60Ω) and high impedances may equal approximately 100Ω or more (e.g., 90-110Ω). In this way, each of the transmitter impedance gradient 76, the transmitter impedance tuner 78, the receiver impedance gradient 80, and/or the receiver impedance tuner 82 may include some combination of capacitances, inductances, resistances, switching circuitry, or the like to permit some frequencies (or frequency ranges) to pass through the respective transmitter balun 58 and/or receiver balun 56 without permitting other frequencies to pass through (or frequency ranges). Thus, each of the transmitter impedance gradient 76, the transmitter impedance tuner 78, the receiver impedance gradient 80, and/or the receiver impedance tuner 82 may permit a passive form of filtering, where the combination of circuitry permits frequency filtering to occur without a controller actively controlling some circuitry of the duplexer 50. However, in some cases each of the transmitter impedance gradient 76, the transmitter impedance tuner 78, the receiver impedance gradient 80, and/or the receiver impedance tuner 82 may permit an active form of filtering, where circuitry causes some frequencies to transmit to an open circuit (e.g., not permitted to pass) and some frequencies to transmit to a short circuit or a closed circuit (e.g., permitted to pass). In this way, in some cases, the duplexer 50 may receive control signals from a controller to operate circuitry of the transmitter impedance gradient 76 and/or the receiver impedance gradient 80 in a low impedance mode or in a high impedance mode.

The primary winding 66 and the primary winding 68 may produce an electromagnetic field due to excitation in connection of the windings to the transmitter 28 and a common return (e.g., ground 84) through the transmitter impedance gradient 76 and the transmitter impedance tuner 78. The field generated at the primary winding 66 and the primary winding 68 may cause (e.g., induce) resulting signals in the secondary winding 70 for transmission through a transmitter impedance inverter 86. Similarly, for the receiver balun 56, signals received at the primary winding 60 from a receiver impedance inverter 88 may cause resulting signals to generate in the secondary winding 62 and/or the secondary winding 64.

The transmitter impedance inverter 86 and/or the receiver impedance inverter 88 may include circuitry that enables an impedance at an input to the transmitter impedance inverter 86 to be different than an impedance at an output of the transmitter impedance inverter 86. For example, the transmitter impedance inverter 86 may include a network of capacitors and/or inductors to generate the input impedance and the different output impedance (e.g., an inductor-capacitor (LC) matching circuit) and/or a quarter wavelength waveguide that changes its output impedance based on an input impedance (e.g., providing a dual or an inverse relationship between an output impedance and an input impedance, such that an infinitely large or relatively large load impedance may cause an infinitely small, or relatively small, input impedance).

The transmitter impedance gradient 76, the transmitter impedance tuner 78, the receiver impedance gradient 80, and/or the receiver impedance tuner 82 may also include circuitry that enables operations in various impedance modes. The circuitry of the transmitter impedance gradient 76 and/or the receiver impedance gradient 80 may cause the impedance gradients to selectively behave like an open circuit or a closed circuit when transmitting signals of different frequencies. For example, the transmitter impedance gradient 76 may permit signals characterized by a frequency in the transmit frequency range to traverse the transmitter balun 58 (e.g., as a "short" circuit permitting signals of transmit frequencies to pass) while disallowing signals characterized by a different frequency (e.g., as an "open" circuit not permitting signals of receive frequencies to pass), such as a frequency in the receive frequency range.

Since the impedance gradients (e.g., transmitter impedance gradient 76, receiver impedance gradient 80) may be implemented using real-world components, the high impedance and low impedance settings for the impedance gradients may be values other than ideal short and open values (e.g., 0Ω and ∞Ω). The impedance tuners (e.g., transmitter impedance tuner 78, receiver impedance tuner 82) may be used to compensate for the non-ideal operation of the impedance gradients (e.g., transmitter impedance gradient 76, receiver impedance gradient 80). The impedance tuners may include one or more potentiometers to tune or adjust impedances between the transmitter impedance gradients 76 and/or the receiver impedance gradients 80.

Furthermore, a concern in operation of the duplexer 50 may be an abrupt change in impedance at the transmit and receive frequencies. The impedance tuner may reduce a likelihood of an abrupt change in impedance at the transmit and receive frequencies used by the impedance gradients. Whereas the impedance gradients (e.g., transmitter impedance gradient 76, receiver impedance gradient 80) act as filters, the impedance tuners (e.g., transmitter impedance tuner 78, receiver impedance tuner 82) have a low impedance in the "pass" band (e.g., frequency band in which an impedance tuner enables a signal of that frequency to pass through) for the respective balun and replicate the impedance of the corresponding impedance gradient in the "block" band (e.g., frequency band in which an impedance tuner blocks a signal of that frequency). In other words, in some embodiments, the impedance tuners (e.g., transmitter impedance tuner 78, receiver impedance tuner 82) may provide a low impedance lower than the high impedance of a corresponding impedance gradient for passed frequencies while providing a low impedance substantially similar to the low impedance (e.g., impedance for passed frequencies) for blocked frequencies.

By leveraging the different impedances of the transmitter impedance inverter 86, the receiver impedance inverter 88, the transmitter impedance gradient 76, the transmitter impedance tuner 78, the receiver impedance gradient 80, and/or the receiver impedance tuner 82, signals may be guided to transmit through one path as opposed to another. For example, signals that traverse the transmitter balun 58 may be transmitted via the antenna 20. However, some of the signals that traverse the transmitter balun 58 may be of suitable frequency range or may generate signals of suitable frequency range to also traverse the receiver balun 56. To ensure effective transmission of the transmit signals without unintentional generation of signals characterized by the receive frequency range, these signals may be blocked by the input impedance of a receiver impedance inverter 88 while the transmit operation occurs. For example, while the transmit operation occurs, an impedance associated with the input of the receiver impedance inverter 88 may be greater than an impedance of the antenna 20 to increase a likelihood that signals transmitted as part of the transmit operation transmit via the antenna 20, as elaborated on with discussion of FIGS. 8-16. It is noted that the receiver impedance inverter 88 may include a network of capacitors and/or inductors to generate the input impedance and the output impedance. The passing of the signal through the transmitter balun 58 causes a signal to be induced on the secondary winding 70 for transmission to the antenna 20.

Similarly, the antenna 20 may receive signals and transmit the signals through the receiver balun 56 for provision to the receiver 27. The receiver balun 56 includes the secondary winding 62 and the secondary winding 64, which may generate a signal using an electromagnetic field generated by the primary winding 60. The primary winding 60 may receive a signal from the antenna 20 and may generate the electromagnetic field in response to the signal based on the receiver impedance inverter 88 providing an impedance to the antenna 20 that permits passing of signals across the receiver balun 56 during a receive operation. Although the impendence of the receiver impedance inverter 88 may be of any suitable value, the impedance at an input of the receiver impedance inverter 88 during a receive operation may correspond to a lower impedance than an impedance at an output of the transmitter impedance inverter 86.

It is noted that the duplexer 50 may operate in a full duplexer mode or a half duplexer mode and/or may operate as a frequency division duplex (FDD) system and/or as a time division duplex (TDD) system. The duplexer 50 may operate to transmit and receive signals at the same time (e.g., concurrently or simultaneously) during the full duplexer mode (e.g., FDD system) and may operate to transmit signals at a different time than receiving signals during the half duplexer mode (e.g., TDD system). In this way, the duplexer 50 may use a separate frequency band for the receive operation than for the transmit operation when operating as an FDD system. The duplexer 50 may use a same frequency band for the receive operation and the transmit operation when operating as a TDD system, relying on time to separate the signals for each operation.

When the duplexer 50 is operating in the full duplexer mode, circuitry associated with the receiver balun 56 may operate to filter out signals associated with the transmit operation while circuitry associated with the transmitter balun 58 operate to filter out signals associated with the receive operation. For example, the transmitter impedance gradient 76 may block signals in the transmit operation frequency range and pass signals in the receive operation frequency range. Thus, when describing operation of the transmitter impedance gradient 76 from a perspective of a transmit operation, the transmitter impedance gradient 76 may be described as being in a high impedance mode relative to frequency ranges used for the transmit operation. However, when describing operation of the transmitter impedance gradient 76 from a perspective of a receive operation, the transmitter impedance gradient 76 may be described as being in a low impedance mode relative to frequency ranges used for the receive operation. In this way, when operating in a full duplexer mode, the output of transmitter impedance inverter 86 may have a high impedance while the input of the receiver impedance inverter 88 may have a low impedance for signals of the receive frequency range, where the combination of the two impedances may cause signals in the receive frequency range to transmit from the antenna 20 through the receiver impedance inverter 88 as opposed to through the transmitter impedance inverter 86. These modes are described further with respect to FIGS. 8-11. By including the impedance inverters (e.g., transmitter impedance inverter 86, receiver impedance inverter 88) in the duplexer 50, insertion loss of the duplexer 50 may reduce from approximately 6-8 decibels (dB) to approximately 1-3 dB.

To elaborate further on operation of the duplexer 50, FIG. 8 is a block diagram of a first mode of operation of the duplexer 50 (e.g., the transmit mode) for at least one frequency range (e.g., a transmit frequency range). While operating in the transmit mode, the duplexer 50 may be operated by a controller, such as a controller associated with the processors 12, in one or more impedance configurations affecting signals of the frequency range. For example, the controller may operate circuitry of the duplexer 50 in to a variety of impedance operational modes. For example, the transmitter impedance gradient 76 may be operated in a high impedance mode during the transmit operation (as shown in FIG. 8) and a low impedance mode during the receive operation (as shown in FIG. 10). It is also noted that the components of the duplexer 50 may simultaneously operate in low impedance modes for some frequencies but high impedance modes for other frequencies to help isolate operations of the receiver 27 from operations of the transmitter 28. This simultaneous operation may occur when the duplexer 50 is operated in a full duplexer mode.

For example, the impedance modes may be particularly designed based on transmit frequencies and receive frequencies, such that signals within a transmit frequency range experience the low impedance and signals within a receive frequency range experience a high impedance while the duplexer 50 is in a full duplexer mode. The transmitter impedance gradient 76, the transmitter impedance tuner 78, the transmitter impedance inverter 86, the receiver impedance gradient 80, the receiver impedance tuner 82, and the receiver impedance inverter 88 may include filtering circuitry (e.g., bandpass filter, notch filter, stopband filter). The filtering circuitry may include one or more inductors, one or more capacitors, and/or one or more resistors that cause certain frequencies to attenuate similar to as if the signal was attempted to be transmitted through an open circuit (e.g., a high impedance) and/or to not attenuate similar to as if the signal was transmitted through a closed circuit (e.g., a low impedance).

In this example, to operate the duplexer 50 in a half duplexer mode to prepare for a transmit operation, a controller may operate the transmitter impedance gradient 76 in a high impedance mode while operating the transmitter impedance tuner 78, the receiver impedance gradient 80, and the receiver impedance tuner 82 in a low impedance mode. When the components of the duplexer 50 operate in these modes (e.g., configurations), the transmitter impedance inverter 86 and the receiver impedance inverter 88 may operate in a low-high impedance mode. For the transmitter impedance inverter 86, the low-high impedance mode corresponds to a low impedance at an input and a high impedance at an output of the transmitter impedance inverter 86. While, for the receiver impedance inverter 88, the low-high impedance mode corresponds to a high impedance at an input and a low impedance at an output of the receiver impedance inverter 88. In this way, when a signal transmitted during the transmit operation of the duplexer 50 tries to transverse the receiver balun 56 or the transmitter balun 58, the signal is stopped by the high impedance of the transmitter impedance inverter 86 and/or the receiver impedance inverter 88.

To further explain the transmit operation of the duplexer 50, FIG. 9 is a flow chart of a method 100 for operating the electronic device 10 to transmit signals according to the first mode of operation shown in FIG. 8, according to embodiments of the present disclosure. It is noted that, although depicted in a particular order, some operations of the method 100 may be performed in any suitable order, and at least some blocks may be skipped altogether. As described herein, the method 100 is described as performed by a controller of the electronic device 10, however, it should be understood that any suitable processing and/or control circuitry may perform some or all of the operations of the method 100, such as other processor circuitry of the processors 12. It is noted that at least some of the blocks of the flow chart may correspond to operations used to configure the duplexer 50 in a particular configuration while operating in a half duplexer mode. When the duplexer 50 is operating in a full duplexer mode, the duplexer 50 may not be configured between transmit and receive operations, and may perform both substantially simultaneous to each other.

At block 110, a controller operating the duplexer 50 may receive an indication from the electronic device 10 to transmit an output signal through the transmitter balun 58 from the transmitter 28 to the antenna 20. In this way, the electronic device 10 may determine that a transmit operation is incoming or is otherwise about to occur based on receiving the indication. The electronic device 10 may reference a communication configuration stored in the memory 14 to determine that a next communication is to be an outgoing communication via the antenna 20. The communication configuration may specify when the electronic device 10 is to transmit data and when the electronic device 10 is to receive data.

At block 112, the controller may operate (e.g., instruct, transmit a control signal to cause operation of) the transmitter impedance gradient 76 in a high impedance mode. At block 114, the controller may operate the receiver impedance gradient in a low impedance mode. The operations of block 112 and/or block 114 may be substantially simultaneous to the transmitter impedance tuner 78 and the receiver impedance tuner 82 being in a low impedance mode. The transmitter impedance tuner 78 and/or the receiver impedance tuner 82 may operate in an impedance mode unchanged between transmit operations and receive operations. In some cases, the controller may retune (e.g., adjust) impedances of the transmitter impedance tuner 78 and/or the receiver impedance tuner 82 to compensate for any shift in impedance experienced by the duplexer 50, such as to keep circuitry of the duplexer 50 balanced and/or suitably operating. To do so, the controller may perform a calibration process by transmitting a known signal and adjusting operation of the impedance tuners until achieving a desired operation (e.g., until a threshold amount of isolation or isolation loss is realized between transmit operations and receive operations).

In response to the combination of operational modes of the transmitter impedance gradient 76, the transmitter impedance tuner 78, the receiver impedance gradient 80, and the receiver impedance tuner 82, the receiver impedance inverter 88 may operate in a low-high impedance mode and the transmitter impedance inverter 86 may operate in the low-high impedance mode. The impedance inverters (e.g., receiver impedance inverter 88, transmitter impedance inverter 86) may each include discrete components with respective inductances and/or may include a respective quarter wavelength waveguide with an impedance that is dependent on an impedance of a load of the waveguide, and thus may autonomously operate and/or may automatically switch to operate in the respective operational mode. For example, the receiver impedance inverter 88 may transition its impedance to the low-high impedance mode in response to the impedance of the receiver impedance gradient 80 being set to the low impedance mode. While in this combination of operational modes, the signals from the PA 54 of the transmit frequency range may transmit from the antenna 20 and signals of the receive frequency range may not transmit to the LNA 52 (e.g., reduce a likelihood of transmission to the LNA 52).

At block 116, once each circuitry is in its appropriate operating mode, the controller may proceed with transmitting a control signal to cause transmission of an output from the antenna 20. In other words, after the transmitter impedance gradient 76 is set in the high impedance mode, and the transmitter impedance tuner 78, the receiver impedance gradient 80, and the receiver impedance tuner 82 are set in the low impedance mode, the controller may proceed to instruct the electronic device 10 to perform the scheduled transmit operation. Transmitting the signal may cause the combination of the transmitter impedance gradient 76 and the transmitter impedance tuner 78 to provide a generally low impedance to the input of the transmitter impedance inverter 86 relative to the relatively high impedance of the antenna 20, which causes the transmitter impedance inverter 86 to operate in the low-high impedance mode.

Similar systems and methods may be used for a receive operation of the electronic device 10. FIG. 10 is a block diagram of a second mode of operation of the duplexer 50 (e.g., the receive mode) for at least one frequency range (e.g., a receive frequency range). While operating in the receive mode, a controller of the electronic device 10, such as a controller associated with the processors 12, may operate the duplexer 50 in one or more impedance configurations affecting signals of the receive frequency range. For example, the controller may operate circuitry of the duplexer 50 in a high impedance mode, a low impedance mode, a low-high impedance mode, or a high-low impedance mode based on the mode of operation in which the duplexer 50 is to be operated. It is also noted that certain components may maintain impedance modes of the transmit operation substantially simultaneous to impedance modes of the receive operation, such as when the duplexer 50 operates in a full duplexer mode. The duplexer 50 operating in the full duplexer mode may continue to provide separation between signals of the transmit operations and signals of the receive operations even when the operations occur at the same time. The duplexer 50 may provide separation between the operations by components used to provide the duplexer since impedances of components may permit signals in the different frequency ranges may be affected by differently by the various operational modes. For example, the transmitter impedance gradient 76 may simultaneously affect transmit signals in the transmit frequency range in the high impedance mode while affecting receive signals in the receive frequency range in the low impedance mode due at least in part to filtering circuitry included within the transmitter impedance gradient 76. When the duplexer 50 operates in a half duplexer mode, the controller may operate the duplexer 50 to perform a transmit operation separate (e.g., non-simultaneous) to the duplexer 50 performing a receive operation.

For the receive mode, the controller may operate the transmitter impedance gradient 76, the transmitter impedance tuner 78, and the receiver impedance tuner 82 in a low impedance mode while operating the receiver impedance gradient 80 in a high impedance mode. Furthermore, the transition of the components of the duplexer 50 in respective impedance modes may cause the operation of the transmitter impedance inverter 86 in a low-high impedance mode and the receiver impedance inverter 88 in a high-low impedance mode. This combination of impedance states may permit signals received at the antenna 20 to transmit to the LNA 52 when within the receive frequency range. This may reduce a likelihood of signals from the antenna 20 transmitting to the transmitter balun 58. With the transmitter impedance inverter 86 configured to provide a high impedance at its output and with the receiver impedance inverter 88 configured to provide a low impedance at its input, the antenna 20 may receive signals characterized by a frequency within the transmit frequency range. The signals of the transmit frequency may, however, be stopped by the transmitter impedance inverter 86 from transference across the transmitter balun 58 due to the high impedance blocking the signals. Signals having a frequency within the receive frequency range may be received at the antenna 20 and transmitted to the receiver impedance inverter 88. The signals may transmit through the primary winding 60 and induce signals in the secondary winding 62 and the secondary winding 64. The induced signals may transmit from the secondary winding 62 and the secondary winding 64 to the receiver 27 after amplification in the LNA 52. It may be noted that the signals received at the antenna 20 may find the ground voltage (e.g., ground 84) through the receiver impedance inverter 88, and thus are blocked from transmitting through the transmitter impedance inverter 86.

To help explain the transmit operation of the duplexer 50, FIG. 11 is a flow chart of a method 132 for operating the electronic device 10 to receive signals according to the second mode of operation shown in FIG. 10, according to embodiments of the present disclosure. It is noted that, although depicted in a particular order, some operations of the method 132 may be performed in any suitable order, and at least some blocks may be skipped altogether. As described herein, the method 132 is described as performed by a controller of the electronic device 10, such as one or more of the processors 12, however, it should be understood that any suitable processing and/or control circuitry may perform some or all of the operations of the method 132. It is noted that the method 132 may correspond to operations used to configure the duplexer 50 in a particular configuration while operating in a half duplexer mode. When the duplexer 50 is operating in a full duplexer mode, the duplexer 50 may perform both transmit operations and receive operations substantially simultaneous to each other since sometimes the impedance gradients and/or the impedance inverters are configurable to substantially simultaneously hold the two impedance modes.

At block 134, a controller operating the duplexer 50 may receive an indication from the electronic device 10 to transmit an input signal from the antenna 20 through the receiver balun 56 to the receiver 27. The electronic device 10 may reference a communication configuration, such as via the controller, to determine that a next communication is to be an incoming communication via the antenna 20. The communication configuration may specify when the electronic device 10 is to transmit data and when the electronic device 10 is to receive data, and thus may indicate the next communication that is expected to occur. Operating according to a communication configuration may reduce a likelihood that errant signals in the receive frequency range (e.g., signals not directed at a communication to be received by the electronic device 10) are collected via the antenna 20 and/or transmitted to the receiver 27.

At block 136, the controller may operate (e.g., instruct, transmit a control signal to cause operation) the transmitter impedance gradient 76, the receiver impedance tuner 82, and/or the transmitter impedance tuner 78 in a low impedance mode. At block 138, the electronic device 10 may operate the receiver impedance gradient 80 in a high impedance mode. In some embodiments, the operations of block 136 and/or block 138 may include the controller operating just the impedance gradients in the particular operation modes and be performed substantially simultaneous to the transmitter impedance tuner 78 and the receiver impedance tuner 82 already being in a low impedance mode. This is because the transmitter impedance tuner 78 and/or the receiver impedance tuner 82 may operate in an impedance mode unchanged between transmit operations and receive operations. In some cases, the controller may retune impedances of the transmitter impedance tuner 78 and/or the receiver impedance tuner 82 to compensate for any shift in impedance experienced by the duplexer 50, such as to keep circuitry of the duplexer 50 balanced and/or suitably operating. To do so, the controller may perform a calibration process by transmitting a known signal and adjusting operation of the impedance tuners until reaching a desired operation (e.g., until a threshold amount of isolation or isolation loss is realized between transmit operations and receive operations).

The receiver impedance inverter 88 may transition its impedance to a low-high impedance mode. For example, when the receiver impedance inverter 88 includes a quarter-wavelength waveguide, an impedance of a load of the quarter-wavelength waveguide may be based on an impedance of an input to the quarter-wavelength waveguide. Thus, the larger an impedance of the load, the lower the impedance is at the input (e.g., an inverse relationship between input impedance and output impedance). Since the impedance of the receiver impedance gradient 80 may change the impedance seen at the output of the receiver impedance inverter 88 when implemented as a waveguide, the impedance seen at the input of the receiver impedance inverter 88 may change in response to the setting of the impedance of the receiver impedance gradient 80.

At block 140, once each circuitry is in its suitable operating mode, the controller may proceed with transmitting a control signal to cause suitable signals received by the antenna 20 to transmit through the LNA 52. In other words, after the transmitter impedance gradient 76 is set in the high impedance mode, and the transmitter impedance tuner 78, the receiver impedance gradient 80, and the receiver impedance tuner 82 are set in the low impedance mode, the controller may proceed to instruct the electronic device 10 to perform the scheduled receive operation. Receiving the signal may cause the combination of the receiver impedance gradient 80 and the receiver impedance tuner 82 to provide a generally high impedance to the output of the receiver impedance inverter 88 relative to the relatively low impedance of the antenna 20 now receiving a signal, causing the receiver impedance inverter 88 to operate in the high-low impedance mode (e.g., operate to provide a low input impedance and a high output impedance).

In some cases, including filters with circuitry of the duplexer 50 may improve isolation between transmit operations and receive operations. For example, when it is desired to have a certain amount of filtering, such as isolation of levels greater than 30 dB, such as between 50 dB and 60 dB isolation, filtering circuitry may be added to the duplexer 50 to provide a relatively larger amount isolation and increase an amount of impedance matching between portions of circuitry (e.g., between receiver impedance gradient 80 and the receiver impedance tuner 82). Any suitable filter may be used, such as a notch filter, a bandpass filter, a n-path filter, an inductor-capacitor filter, a bridge filter, or the like.

Figure 12:
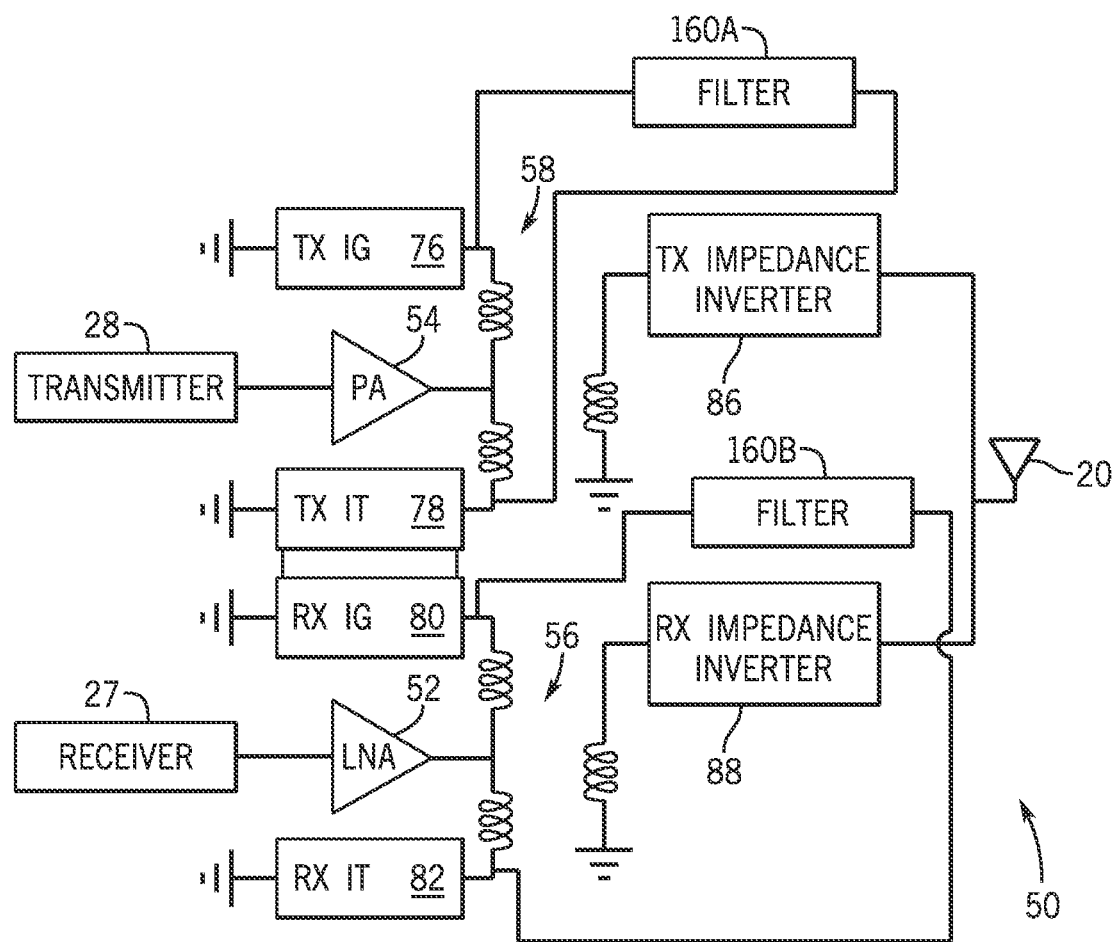
FIG. 12 is a block diagram of the EBD of FIG. 7 with filtering circuitry (e.g., filters), in accordance with embodiments of the present disclosure.

For example, FIG. 12 is a block diagram of the duplexer 50 including filters 160 (e.g., filter 160A, filter 160B). Operation of the duplexer 50 in a full duplexer mode, a half duplexer mode, and/or in the various impedance modes may be combined with operation of the duplexer 50 to include the filters 160. Furthermore, although not particularly illustrated, it is noted that the filters 160 may be selectively included with the duplexer 50, and thus may couple to circuitry of the duplexer 50 through, for example, switching circuitry (e.g., circuitry that enables or disables one or more filters 160 in response to a control signal from the controller).

The filters 160 may include any suitable filtering circuitry, and the filter 160A may include same or different filtering circuitry from the filter 160B. In this way, each of the filters 160 may include a same or different combination of resistors, inductors, capacitors, and/or switches to achieve a desired filtering operation. In some embodiments, multiple filters may be included. A respective filter may be selectively coupled to the duplexer 50 as the filter 160A and/or the filter 160B. For example, a determination of which filter is more suitable for a particular application or communication frequency may cause generation of a control signal to couple or uncouple certain filters from the duplexer 50. In some cases, filter circuitry may be shared between duplexers 50 when the electronic device 10 includes more than one duplexer 50.

Operation of the duplexer 50 may be similar to that described above. The filters 160 couple to respective nodes of the duplexer 50 to facilitate balancing out of node voltages within the duplexer 50, thereby improving isolation operations.

In particular, as illustrated, the filter 160A couples to an output from the transmitter impedance gradient 76 and to an output from the transmitter impedance tuner 78. Thus, the filter 160A may distribute charges between the nodes, enabling the voltage at the two nodes to be substantially similar. Equalizing of the voltages between respective nodes of the duplexer 50 may enable the duplexer 50 to operate closer to an ideal state, thus improving isolation between transmit operations and receive operations of the duplexer 50, and thereby improving performance of the duplexer 50 (and performance of operations that use transmitted or received signals).

Figures 13, 14:
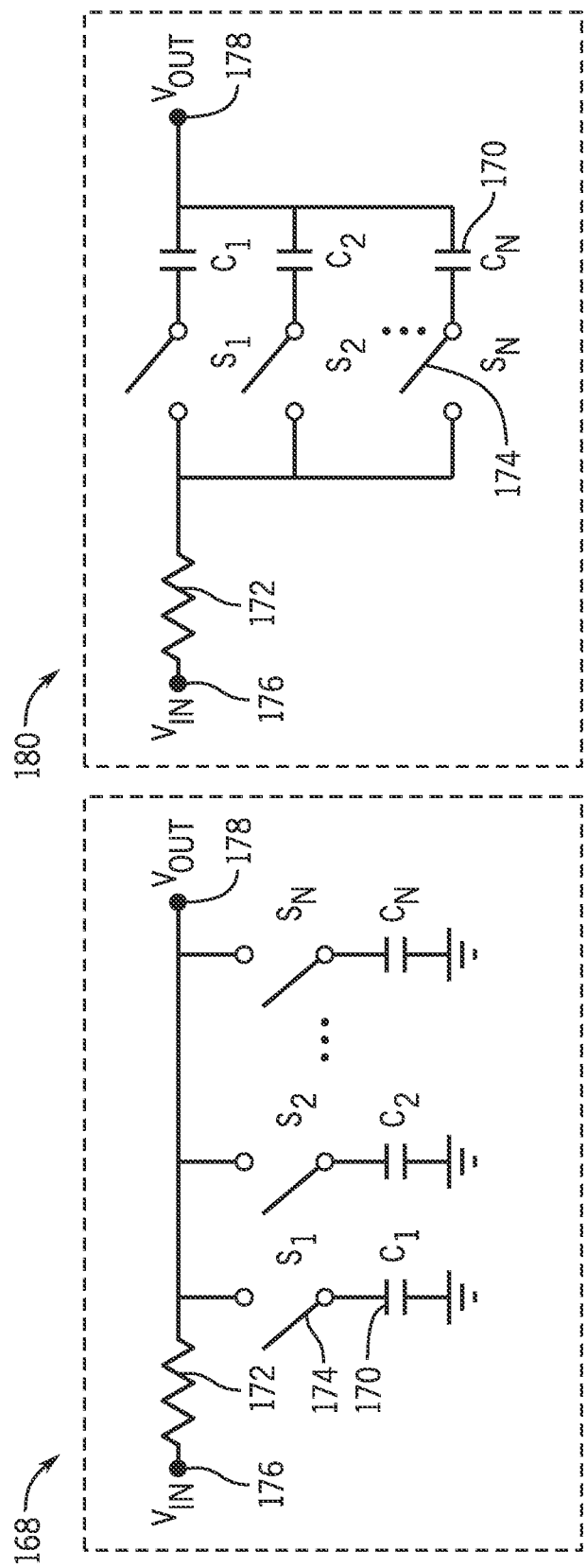
FIG. 13 is a circuit diagram of first example filtering circuitry for use in the EBD of FIG. 12, in accordance with embodiments of the present disclosure.
FIG. 14 is a circuit diagram of second example filtering circuitry for use in the EBD of FIG. 12, in accordance with embodiments of the present disclosure.

FIG. 13 is a circuit diagram of an example filter that may be used as the filter 160A and/or the filter 160B. In particular, FIG. 13 is a bandpass filter 168 that includes one or more capacitors 170, one or more resistors 172, and/or one or more switches 174. The combination of the capacitors 170 and the resistors 172 coupled between the input (e.g., terminal 176) and output (e.g., terminal 178) to the bandpass filter 168 may change which frequencies (e.g., frequency ranges) pass through the bandpass filter 168 with negligible attenuation and which frequencies attenuate (e.g., are blocked or filtered out) when passed through the bandpass filter 168.

A controller of the electronic device 10 may respectively open or close each of the switches 174 to change the frequencies permitted to transmit from the bandpass filter 168. In particular, an impedance of the bandpass filter 168 may change as the particular combination of capacitors 170 changes, thereby changing the permitted frequency range.

It is noted that each of the capacitors 170 may be of a same or different capacitance value. It is also noted that the impedance of the bandpass filter 168 may change overtime, and thus may be adjusted to compensate for the change overtime. For example, the controller of the electronic device 10 may adjust which combination of switches 174 to close to maintain an impedance of the bandpass filter 168 relatively constant over time (e.g., to compensate for changes to impedance over time due to aging or use of components of the duplexer and/or the electronic device 10).

When including the bandpass filter 168 in the duplexer 50 for the transmitter balun 58, the terminal 176 may couple to the transmitter impedance gradient 76, and the terminal 178 may couple to the transmitter impedance tuner 78. For the receiver balun 56, the terminal 176 may couple to the receiver impedance gradient 80, and the terminal 178 may couple to the receiver impedance tuner 82. When coupled in this way, the filter 160A may be configurable to pass signals corresponding to the transmit frequencies while the filter 160B may be configurable to pass signals corresponding to the receive frequencies. Performance of the filters 160 may be maintained over time since the electronic device 10 may adjust respective impedances of the filters 160 to compensate for changes in impedances over time (e.g., due to aging).

FIG. 14 is a circuit diagram of another example filter that may be used as the filter 160A and/or the filter 160B. In particular, FIG. 14 is a notch filter 180 (e.g., a band-stop filter) that includes one or more capacitors 170, one or more resistors 172, and/or one or more switches 174. The combination of the capacitors 170 and the resistors 172 that couple between the input (e.g., terminal 176) and output (e.g., terminal 178) of the notch filter 180 may change which frequencies pass through the notch filter 180 with negligible attenuation and which frequencies attenuate (e.g., are blocked or filtered out) when passed through the filter. The notch filter 180 may have a stopband that causes a frequency range to attenuate without attenuating signals outside of the frequency range. In this way, the notch filter 180 may make a virtual short for frequencies within the stopband and thereby provide additional isolation and/or improved amounts of insertion loss (e.g., between −1 dB and −2 dB, −1.7 dB) between operations of the duplexer 50. Similar to the filter of FIG. 13, a controller of the electronic device may use control signals to configure the notch filter 180. The controller may adjust an impedance of the notch filter 180 by switching in respective combinations of the capacitors 170, and thus adjust which frequencies are attenuated and which frequencies are passed. The terminal 176 and the terminal 178 may couple similarly to the components of the duplexer 50 as that described in FIG. 13.

Figure 16:
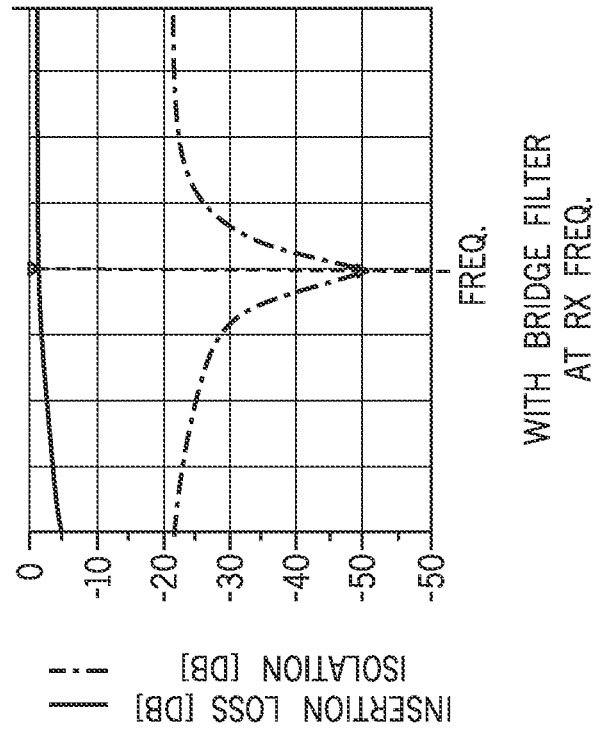
FIG. 16 is a graph showing changes in insertion losses and isolation with increasing frequency of signals transmitted through the EBD of FIG. 12, in accordance with embodiments of the present disclosure.
Figure 15:
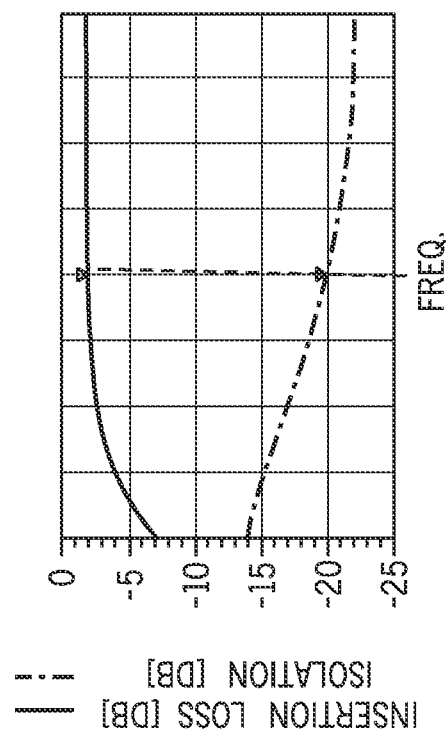
FIG. 15 is a graph showing changes in insertion loss and isolation with increasing frequency of signals transmitted through the EBD of FIG. 7, in accordance with embodiments of the present disclosure.

FIG. 15 and FIG. 16 show improvements to insertion loss and isolation when using the duplexer 50 with the filters 160. FIG. 15 is a graph comparing insertion loss and isolation over frequencies for a duplexer 50 without the filters 160 and FIG. 16 is a graph comparing insertion loss and isolation over frequencies for a duplexer 50 with the filters 160. For ease of explanation, FIGS. 15 and 16 are described together.

Effects of including the filters 160 in the duplexer 50 are emphasized in FIG. 16. In particular, the isolation is relatively more focused and greater when the filters 160 are used. For example, the isolation of the duplexer 50 without the filters 160 is around −20 dB at frequency 190 in FIG. 15, but is around −50 dB at the frequency 190 in FIG. 16, highlighting the improvement achieved by including the filters 160. Furthermore, isolation loss may also improve. For example, FIG. 16 shows an isolation loss of around −1.7 dB, an improvement from the isolation loss of −2 dB resulting at least in part from not including the filters 160.

Technical effects of the systems and methods described herein include a duplexer that improves isolation between a receive operation and a transmit operation. The duplexer may include impedance inverters that act to isolate operations further beyond what combinations of impedance gradients and impedance tuners of transmit baluns and receive baluns may provide. Furthermore, in some cases, the duplexer may include filter circuitry coupled to respective nodes within the duplexer to further improve insertion losses and/or isolation associated with the transmit operations and/or the receive operations of the duplexer.

The specific embodiments described above have been shown by way of example, and it should be understood that these embodiments may be susceptible to various modifications and alternative forms. For example, the methods may be applied for embodiments having different numbers and/or locations for antennas, different groupings, and/or different networks. It should be further understood that the claims are not intended to be limited to the particular forms disclosed, but rather to cover all modifications, equivalents, and alternatives falling within the spirit and scope of this disclosure.

The techniques presented and claimed herein are referenced and applied to material objects and concrete examples of a practical nature that demonstrably improve the present technical field and, as such, are not abstract, intangible or purely theoretical. Further, if any claims appended to the end of this specification contain one or more elements designated as "means for [perform]ing [a function] . . . " or "step for [perform]ing [a function] . . . ", it is intended that such elements are to be interpreted under 35 U.S.C. 112(f). However, for any claims containing elements designated in any other manner, it is intended that such elements are not to be interpreted under 35 U.S.C. 112(f).

What is claimed is:

1. An electronic device comprising:
   a first transformer comprising a first winding, a second winding, and a third winding;
   a transmitter impedance inverter coupled to antenna circuitry and a terminal of the third winding;
   a first amplifier configured to couple to the transmitter impedance inverter via the first transformer, wherein the first amplifier is coupled to a first terminal of the first winding and a first terminal of the second winding; and
   a first filter coupled to the first transformer at a second terminal of the first winding and a second terminal of the second winding, the first filter configured to adjust a first signal from the first amplifier based on being transmitted to the transmitter impedance inverter.

2. The electronic device of claim 1, comprising:
   a receiver impedance inverter;
   a second amplifier configured to couple to the receiver impedance inverter via a second transformer; and
   a second filter coupled to the second transformer, the second filter configured to adjust a second signal from the second amplifier based on being transmitted from the receiver impedance inverter.

3. The electronic device of claim 2, wherein the first amplifier comprises a power amplifier, and wherein the second amplifier comprises a low-noise amplifier.

4. The electronic device of claim 1, comprising:
   a transmitter impedance tuner;
   a transmitter impedance gradient; and
   a receiver impedance tuner, the transmitter impedance tuner, the transmitter impedance gradient, and the receiver impedance tuner being operable in a low impedance mode to cause the transmitter impedance inverter to operate in a low-high impedance mode, the low-high impedance mode configured to block signals received via the antenna circuitry from transmission to the first amplifier.

5. The electronic device of claim 1, comprising:
   a transmitter impedance gradient coupled to the second terminal of the first winding; and
   a transmitter impedance tuner coupled to the second terminal of the second winding.

6. The electronic device of claim 5, wherein the first amplifier is coupled to the first terminal of the second winding and the first winding at the first terminal of the first winding.

7. The electronic device of claim 5, wherein the first filter is coupled to the first winding, the second winding, the transmitter impedance gradient, and the transmitter impedance tuner.

8. The electronic device of claim 1, wherein the first filter comprises a notch filter, a bandpass filter, an n-path filter, an inductor-capacitor filter, a bridge filter, or any combination thereof.

9. The electronic device of claim 1, wherein the first filter comprises one or more switches, one or more resistors, one or more capacitors, or any combination thereof, that are configured to change an impedance of the first filter.

10. A device comprising:
    a transmitter impedance tuner;
    a transmitter impedance gradient; and
    a receiver impedance tuner, the transmitter impedance tuner, the transmitter impedance gradient, and the receiver impedance tuner being operable in a low impedance mode to cause a transmitter impedance inverter to operate in a low-high impedance mode, the low-high impedance mode configured to block signals received at antenna circuitry from transmission.

11. The device of claim 10, comprising a controller coupled to a duplexer comprising the transmitter impedance tuner, the transmitter impedance gradient, the receiver impedance tuner, and the transmitter impedance inverter, the controller configured to
    receive an indication to transmit a signal through a receiver balance-unbalance transformer (balun) from the antenna circuitry to a receiver,
    operate a receiver impedance gradient in a high impedance mode,
    operate the transmitter impedance tuner, the transmitter impedance gradient, and the receiver impedance tuner in the low impedance mode, and
    cause the receiver to receive the signal through the receiver balun from the antenna circuitry.

12. The device of claim 11, wherein the controller is configured to cause the receiver to receive the signal through the receiver balun from the antenna circuitry via a filter.

13. The device of claim 12, wherein the filter comprises a notch filter, a bandpass filter, an n-path filter, an inductor-capacitor filter, a bridge filter, or any combination thereof.

14. The device of claim 10, comprising a controller coupled to a duplexer comprising the transmitter impedance tuner, the transmitter impedance gradient, the receiver impedance tuner, and the transmitter impedance inverter, the controller configured to
    receive an indication that a signal is to be received on a frequency range, and
    operate the transmitter impedance tuner, the receiver impedance tuner, the transmitter impedance inverter, or any combination thereof, to correlate to the frequency range.

15. The device of claim 14, wherein the controller is configured to block the signal transmitted on the frequency range from reaching a transmitter at least in part by operating the transmitter impedance inverter in the low-high impedance mode.

16. A duplexer, comprising:
a transmitter impedance gradient coupled to a first winding of a transformer;
a transmitter impedance tuner coupled to a second winding of the transformer;
a transmitter impedance inverter coupled to a third winding of the transformer; and
a first amplifier coupled to the first winding and the second winding, the first amplifier being configured to transmit a signal to the transmitter impedance inverter via the first winding, the second winding, or both, and the third winding.

17. The duplexer of claim 16, comprising:
a receiver impedance gradient coupled to a fourth winding of the transformer;
a receiver impedance tuner coupled to a fifth winding of the transformer;
a receiver impedance inverter coupled to a sixth winding of the transformer; and
a second amplifier coupled to the fourth winding and the fifth winding of the transformer.

18. The duplexer of claim 17, comprising a filter coupled to the fourth winding, the fifth winding, the receiver impedance gradient, and the receiver impedance tuner.

19. The duplexer of claim 16, comprising a filter coupled to the first winding and to the second winding.

20. The duplexer of claim 19, wherein the filter is configured to adjust the signal transmitted from the first amplifier based on a configurable impedance.

\* \* \* \* \*